(12) United States Patent
Aruga

(10) Patent No.: US 7,991,029 B2
(45) Date of Patent: Aug. 2, 2011

(54) OPTICAL MODULE

(75) Inventor: Hiroshi Aruga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 507 days.

(21) Appl. No.: 12/189,868

(22) Filed: Aug. 12, 2008

(65) Prior Publication Data
US 2009/0135864 A1 May 28, 2009

(30) Foreign Application Priority Data

Nov. 27, 2007 (JP) ................. 2007-306011

(51) Int. Cl.
*H01S 3/04* (2006.01)
(52) U.S. Cl. ............. 372/36; 372/29.01; 372/29.013; 372/29.02; 372/34; 398/164; 257/706; 257/707
(58) Field of Classification Search ........... 372/29.01, 372/34, 29.013, 29.02, 36; 398/164; 257/706, 257/707
See application file for complete search history.

(56) References Cited

U.S. PATENT DOCUMENTS

| 7,030,477 | B2 | 4/2006 | Ishimura |
| 7,274,837 | B2 | 9/2007 | Tanaka et al. |
| 7,366,215 | B2 | 4/2008 | Aruga |
| 2002/0048295 | A1* | 4/2002 | Kato et al. .............. 372/36 |
| 2005/0175312 | A1* | 8/2005 | Tanaka et al. .......... 385/147 |
| 2005/0194663 | A1* | 9/2005 | Ishimura ................ 257/666 |

FOREIGN PATENT DOCUMENTS

| JP | 2001-144366 A | 5/2001 |
| JP | 2005-228766 A | 8/2005 |
| JP | 2005-286305 A | 10/2005 |
| JP | 2006-216839 A | 8/2006 |
| JP | 2007-042756 A | 2/2007 |

* cited by examiner

*Primary Examiner* — Jessica Stultz
*Assistant Examiner* — Yuanda Zhang
(74) *Attorney, Agent, or Firm* — Leydig, Voit & Mayer, Ltd.

(57) ABSTRACT

A cut-out portion of a ground conductor is located in a region where a header faces a flexible board from the junction of a signal pin and a signal line and faces the signal line. The size of the cut-out portion is determined so that the impedance of the signal pin is matched to the impedance of the signal line.

16 Claims, 11 Drawing Sheets

OPTICAL MODULE

BACKGROUND OF THE INVENTION

1. Field of the Invention

The present invention relates to an optical module used in optical communications, and more specifically, to an optical module that can match the impedance of signal pins to that of signal lines even if no impedance matching circuit is provided.

2. Background Art

In recent years, increase in TV channels, such as satellite broadcasting, has been required in cable television to meet the diversity of consumers' tastes. In optical modules used in the delivery of cable television broadcasting, wider bandwidth is also required. On the other hand, since cost reduction is also required, expensive parts to meet requests for bandwidth cannot be used. Conventional optical modules have been constructed in a form referred to as TO-CAN, wherein signal pins provided in the header are simply joined to a laser diode by wire bonding, and have not been designed from the viewpoint of bandwidth widening.

FIG. 10 is a perspective view illustrating a state wherein a conventional optical module is mounted on a printed circuit board, and FIG. 11 is a side view thereof. A header 4 is provided with a lens cap 14, to which a receptacle 15 is connected. The optical module is mounted on the printed circuit board 17 so that the printed circuit board 17 is pinched between the signal pin 1 and the grounding pin 27 of the optical module. A signal line 32 and a ground conductor 31 are provided on the surface and the back face of the printed circuit board 17, respectively, each of which is connected to the signal pin 1 and the grounding pin 27, respectively by a solder 28 so as to be shortest. Since the parasitic inductance components of the signal pin 1 and the grounding pin 27 can be minimized by thus connecting, the deterioration of signals transmitted from the signal line 32 on the printed circuit board 17 can be suppressed, and the signals can be transmitted into the optical module.

However, by the above-described method for fixing the optical module to the printed circuit board, if the gap between the optical module and the printed circuit board was varied, the parasitic inductance of the signal pin 1 and the grounding pin 27 was also varied to change high-frequency characteristics, and stable production was difficult. Furthermore, for signals of higher frequencies, since the parasitic inductance of the signal pin 1 and the grounding pin 27 was measurably large to the signals, a matching circuit for the high-frequency signals was needed on the printed circuit board, and problems of increase in the number of parts and the expansion of mounting space for the matching circuit were caused. To solve these problems, an optical module using a flexible board connecting between the optical module and the printed circuit board has been proposed (for example, refer to Japanese Patent Application Laid-Open No. 2005-286305).

SUMMARY OF THE INVENTION

In an optical module using a flexible board, a resistor had to be provided for matching the impedance of the signal pins and the signal lines. Therefore, there were problems of increase in the number of parts, the occurrence of loss by the resistor, and the lowering of light-emitting efficiency of a laser diode.

To solve the above-described problems, it is an object of the present invention is to provide an optical module that can match the impedance of signal pins and signal lines even if no impedance matching circuit is provided.

According to one aspect of the present invention, an optical module comprises a header; a grounding pin connected to said header; a signal pin penetrating said header; glass burying the space between said header and said signal pin; a laser diode connected to said signal pin; a flexible board provided facing said header; a ground conductor formed on a first surface of said flexible board in a side closer to said header, and connected to said grounding pin; and a signal line formed on a second surface of said flexible board in an opposite side to said first surface, and connected to said signal pin; wherein a cut-out portion is formed in the region where said header faces said flexible board from the joined portion of said signal pin and said signal line by removing said ground conductor in the location facing said signal line; and the size of said cut-out portion is determined so that the impedance of said signal pin is matched with the impedance of said signal line.

According to the present invention, the impedance of signal pins and signal lines can be matched even if no impedance matching circuit is provided.

Other and further objects, features and advantages of the invention will appear more fully from the following description.

DETAILED DESCRIPTION OF THE PREFERRED EMBODIMENTS

First Embodiment

Figure 1:
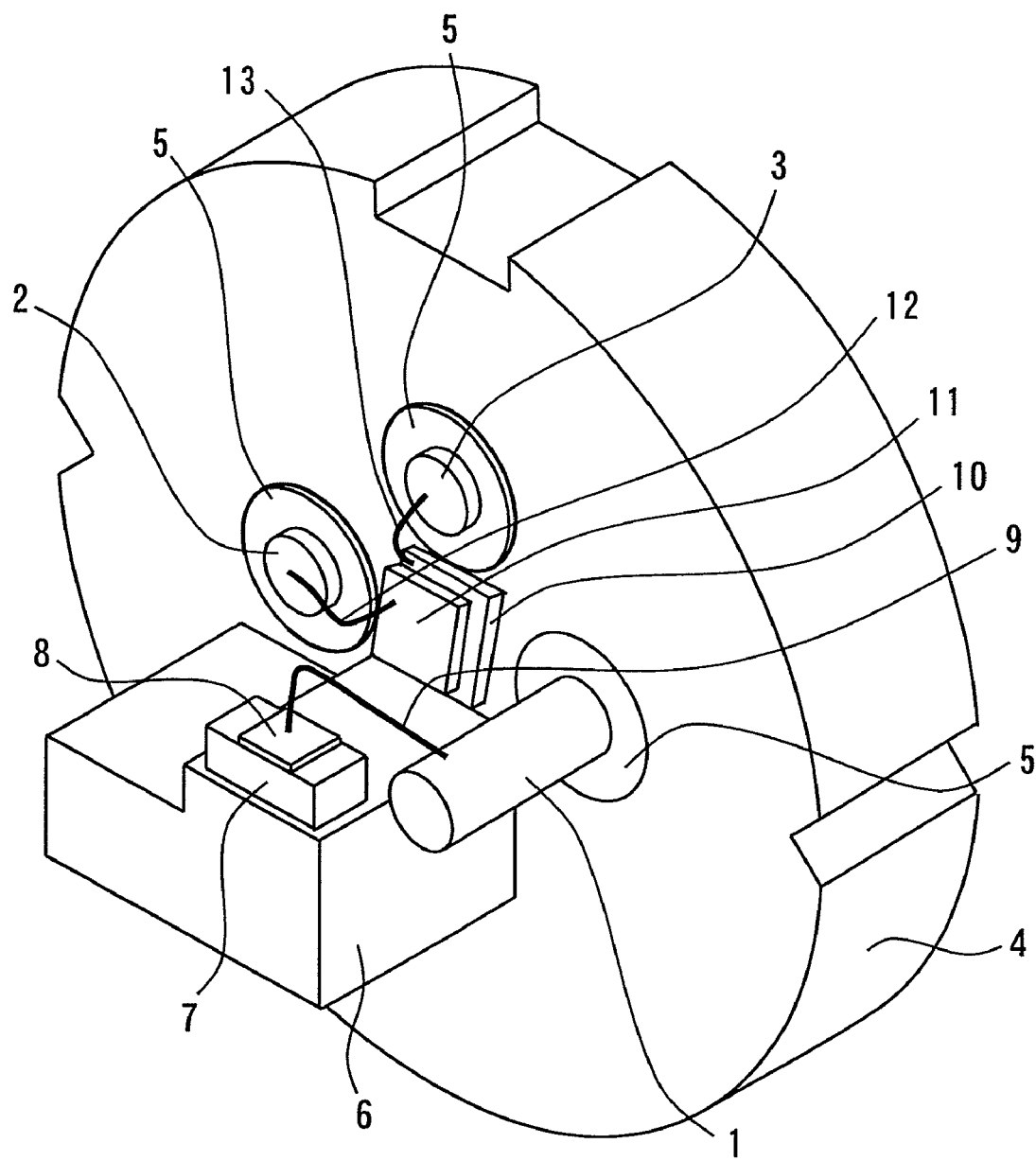
FIG. 1 is a perspective view illustrating the interior of an optical module according to the first embodiment.

FIG. 1 is a perspective view illustrating the interior of an optical module according to the first embodiment. A signal pin 1 and monitor pins 2 and 3 penetrate a conductive header 4. Gaps between the header 4, and the signal pin 1 and monitor pins 2 and 3 are buried by insulating glass 5, respectively. A block 6 is mounted on the header 4, and a laser diode 8 is mounted on the block 6 via a sub-mount 7. The first electrode of the laser diode 8 is connected to the signal pin 1 via a gold wire 9, and the second electrode of the laser diode 8 is connected to the header 4 via a via (not shown) provided on the sub-mount 7.

A photo diode 11 for monitoring is mounted on the header 4 via a PD sub-mount 10. The first electrode of the photo diode 11 is connected to the monitor pin 2 via a gold wire 12, and the second electrode of the photo diode 11 is connected to the PD sub-mount 10. The PD sub-mount 10 connected to the monitor pin 3 via a gold wire 13.

Figure 2:
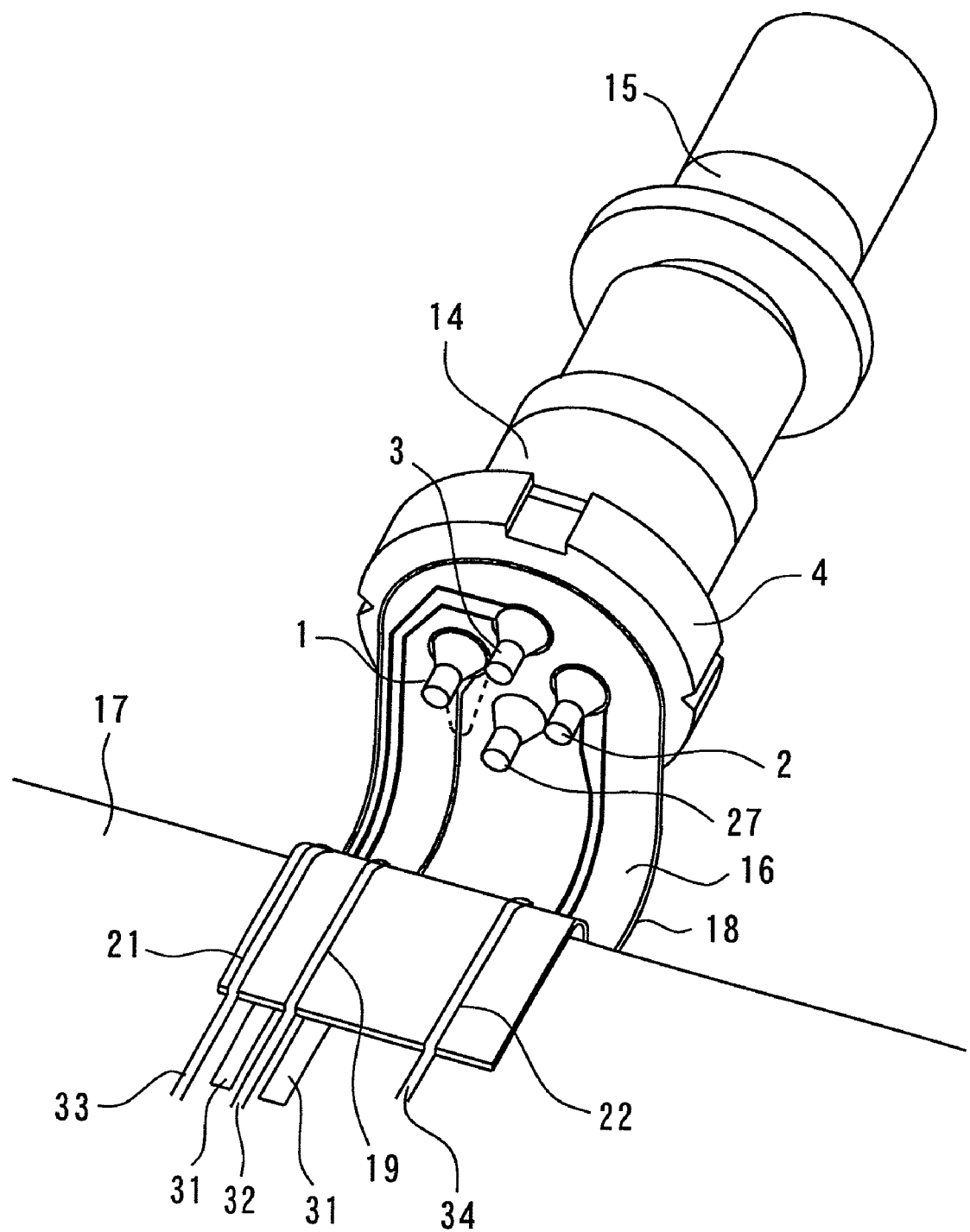
FIG. 2 is a perspective view illustrating the state wherein the optical module according to the first embodiment is mounted on the printed circuit board.
Figure 3:
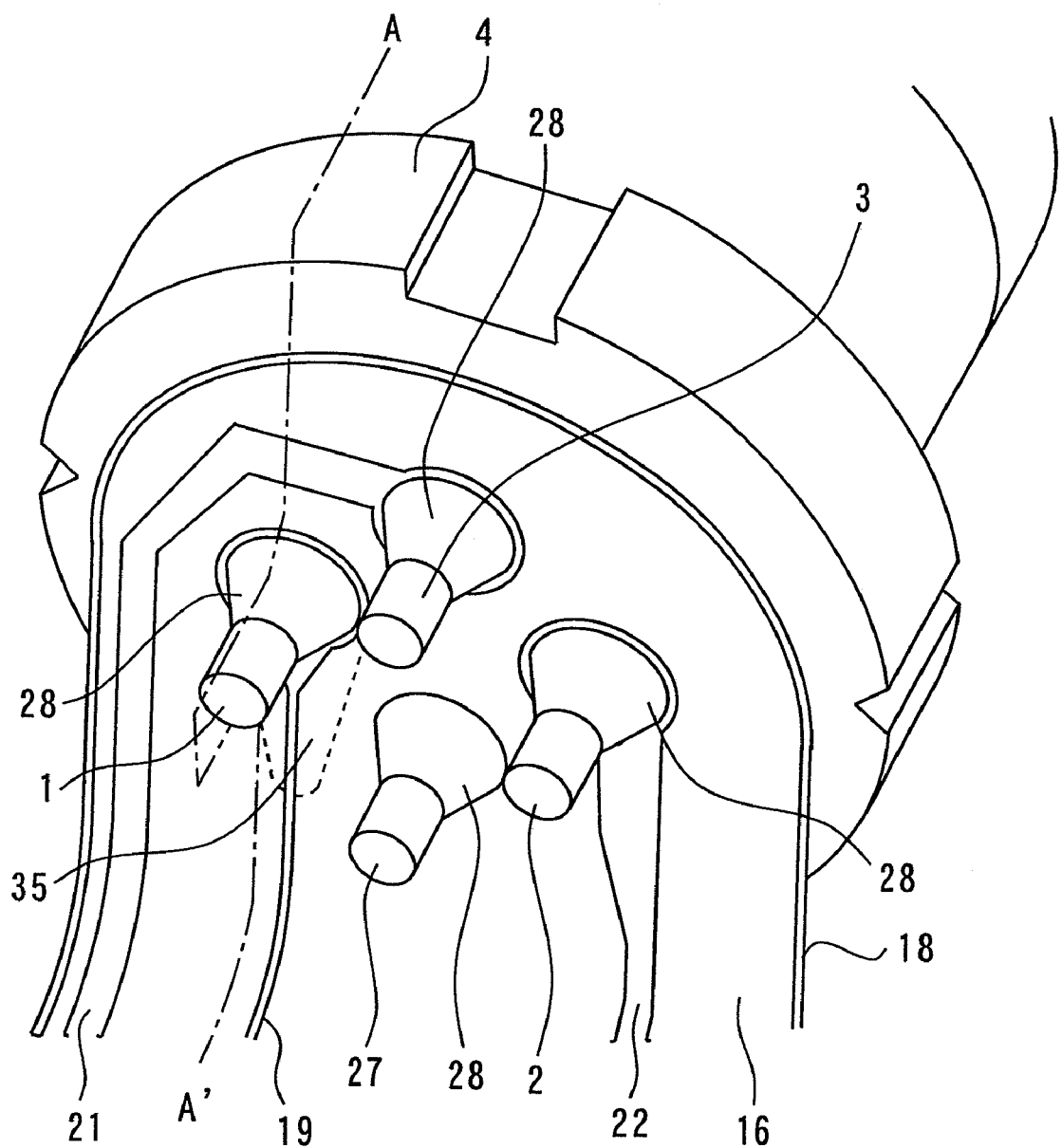
FIG. 3 is partially enlarged perspective view is FIG. 2.
Figure 4:
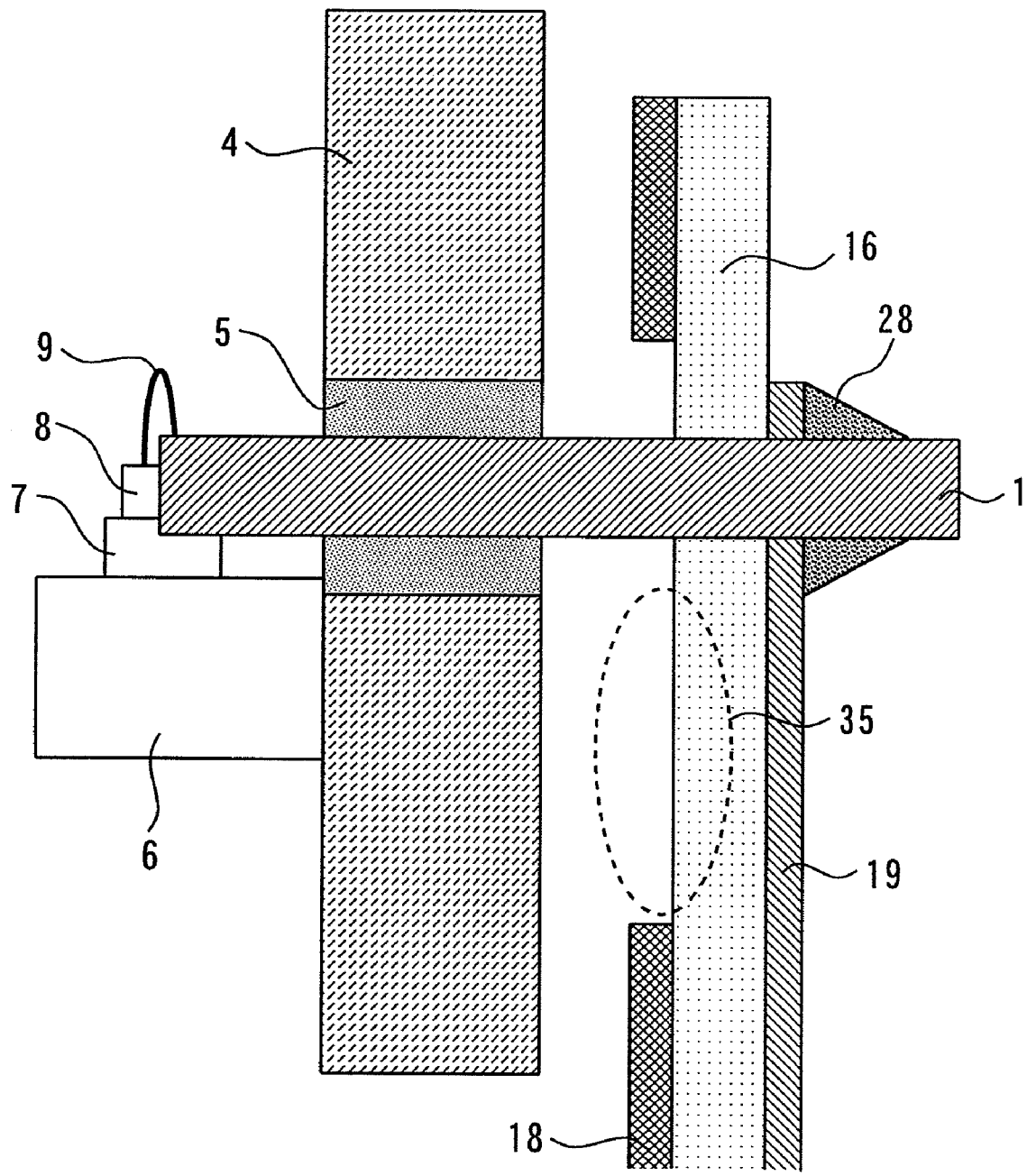
FIG. 4 is a sectional view along the line A-A' in FIG. 3.
Figure 5:
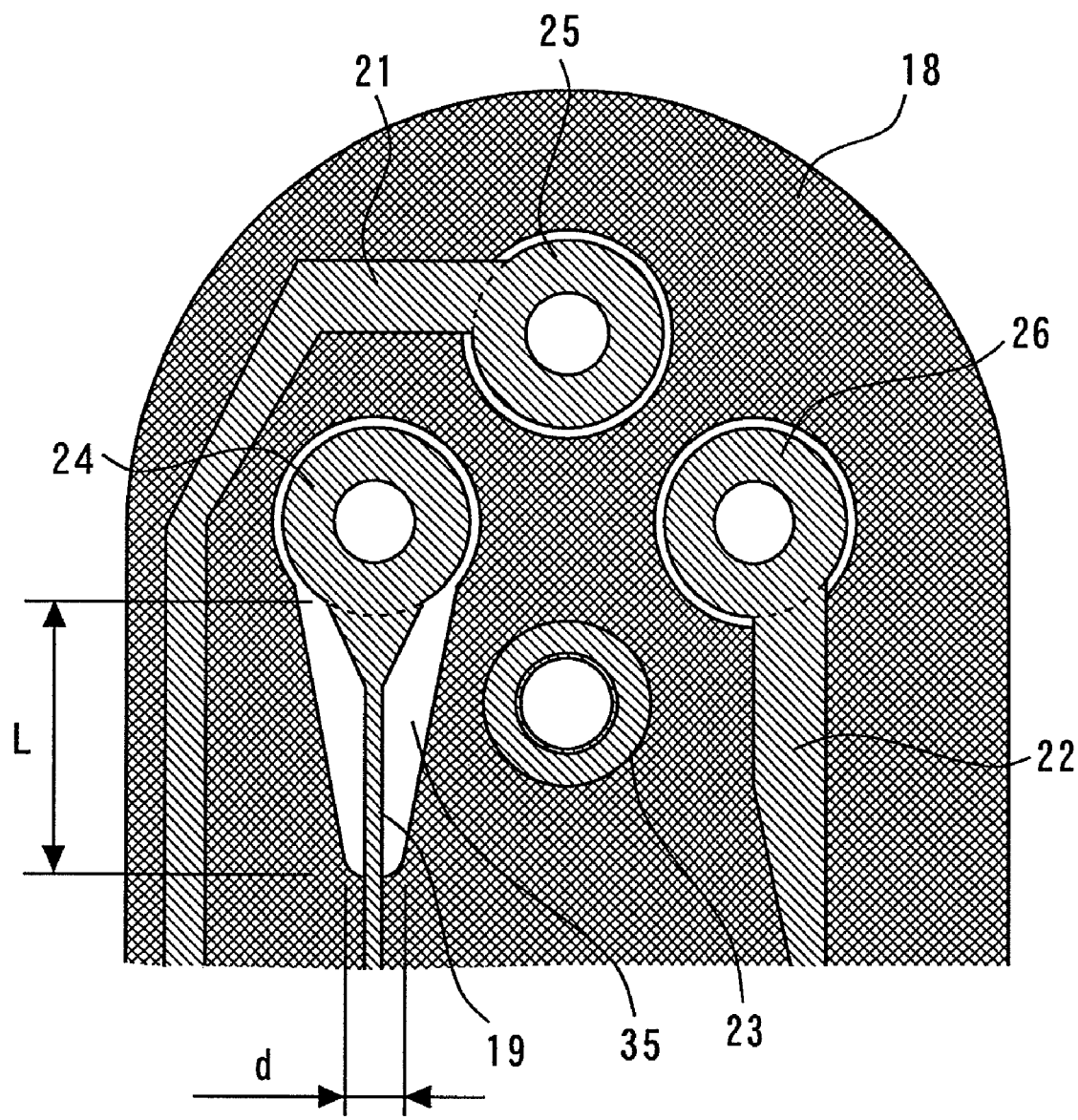
FIG. 5 is a transparent view of a ground conductor and a signal line of a flexible board.

FIG. 2 is a perspective view illustrating the state wherein the optical module according to the first embodiment is mounted on the printed circuit board. FIG. 3 is partially enlarged perspective view is FIG. 2. FIG. 4 is a sectional view along the line A-A' in FIG. 3. FIG. 5 is a transparent view of a ground conductor and a signal line of a flexible board.

The header 4 is provided with a lens cap 14, to which a receptacle 15 is connected. A flexible board 16 is provided facing the header 4. A TO-CAN is connected to a printed circuit board 17 via the flexible board 16. Although not shown in the drawings, a driver circuit for driving the optical module, and a monitor circuit for monitoring the output level of light from the laser diode 8 are mounted on the printed circuit board 17, and connected to a signal line 32, and monitoring lines 33 and 34 on the printed circuit board, respectively.

A ground conductor 18 is formed on the first surface of the flexible board 16 in the side close to the header 4. A signal line 19, monitoring lines 21 and 22, lands 23, 24, 25 and 26 are formed on the second surface of the flexible board 16 in the side opposite to the first surface. The land 23 is connected to the ground conductor 18, the land 24 is connected to the signal line 19, and the lands 25 and 26 are connected to the monitoring lines 21 and 22, respectively.

The grounding pin 27 is connected to the header 4. The signal pin 1 is connected to the land 24, the grounding pin 27 is connected to the land 23, and the monitor pins 2 and 3 are connected to the lands 25 and 26, respectively by the solder 28. The ground conductor 18, the signal line 19, and the monitoring lines 21 and 22 on the flexible board 16 are connected to a ground conductor 31, a signal line 32, and monitoring lines 33 and 34 on the printed circuit board 17, respectively.

As a feature of the present embodiment, the ground conductor 18 in the location facing the signal line 19 is removed in the region where the header 4 faces the flexible board 16 from the joined portion of the signal pin 1 and the signal line 19 to form a cut-out portion 35. The length of the cut-out portion 35 from the joined portion of the signal pin 1 and the signal line 19 in the extending direction of the signal line 19 is represented by L, and the width of the cut-out portion 35 in the direction perpendicular to the extending direction of the signal line 19 is represented by d.

The operation of the above-described optical module will be described. First, modulated signals transmitted from the signal line 19 on the printed circuit board 17 through the signal line 19 on the flexible board 16 penetrates through the header 4 via the land 24, the solder 28, and the signal pin 1, and are transmitted into the TO-CAN. Next, the modulated signals are inputted into the first electrode of the laser diode 8 via a gold wire 9. Corresponding to the inputted modulated signals, the laser diode 8 generates optical output. Then, the modulated signals returned from the second electrode of the laser diode 8 are transmitted to the exterior of the TO-CAN via the sub-mount 7, the block 6, and the header 4. Next, the modulated signals are transmitted to the ground conductor 31 on the printed circuit board 17 via the grounding pin 27, the land 23, the solder 28, and the ground conductor 18 on the flexible board 16.

Figure 6:
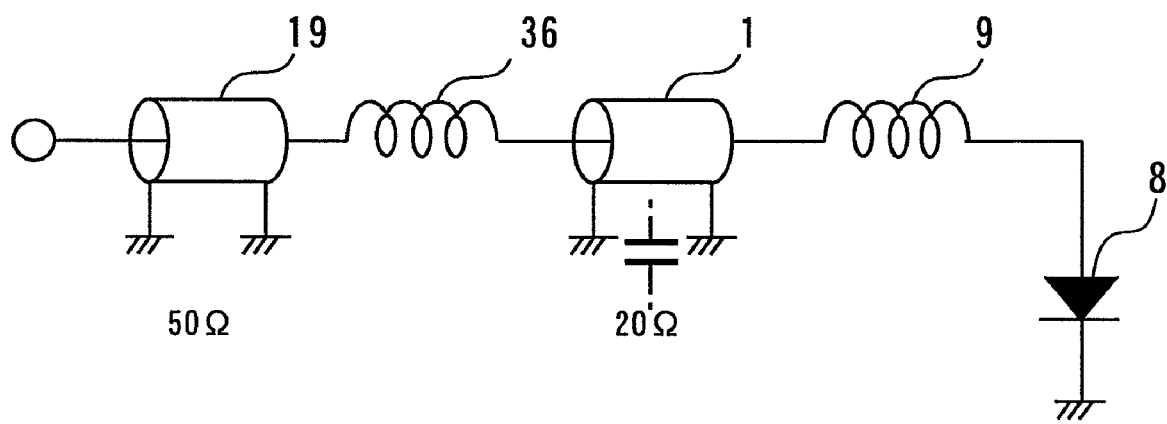
FIG. 6 is an equivalent circuit diagram of the optical module according to the first embodiment.

FIG. 6 is an equivalent circuit diagram of the optical module according to the first embodiment. The signal line 19 and the ground conductor 18 facing via the flexible board 16 constitute a micro-strip line, and the impedance is determined by the gap between them and the line width. Considering the connection to the external connecting devices, such as a driver circuit, the impedance of the signal line 19 is normally set to be 50Ω.

The impedance of the signal pin 1 penetrating the header 4 is determined by the diameter ratio of the glass 5 and the signal pin 1, and the dielectric constant of the glass 5. The diameter ratio of the glass 5 and the signal pin 1 is within a constant range by the restriction in manufacturing of the header 4. For example, when the thickness of the header 4 is 1 mm, the diameter of the glass 5 is 1 mm, and the diameter of the signal pin 1 is 0.45 mm. When the relative permittivity of the glass 5 is 6.7, the impedance of the signal pin 1 becomes 20Ω, which is lower than the impedance of the signal line 19 of 50Ω. Therefore, if the signal pin 1 penetrating the header 4 is connected to the signal line 19 on the flexible board 16 as they are, impedance mismatch occurs, and the band width of high frequency signals is limited. Therefore, a high impedance line 36, that is, an inductive line must be connected to the capacitive low-impedance signal pin 1 in series as means for eliminating impedance mismatch. Thereby, the impedance of the signal pin 1 and the signal line 19 can be matched, and the band width can be expanded to the high-frequency region.

Here, if the line width of the signal line 19 is narrowed, or if the distance between the signal line 19 and the ground conductor 18 is widened, the impedance of the line can be elevated. The thickness of a normally used flexible board 16 is about 25 μm to 50 μm, and the relative permittivity thereof is about 3 to 4. For example, when the thickness of the flexible board 16 is 50 μm and the relative permittivity thereof is 3.2, the impedance of the signal line 19 becomes 50Ω, if the line width is 100 μm. To realize a high-impedance line, if the line width of the signal line 19 is 20 μm, the impedance becomes 90Ω. However, it is generally difficult to make the line width of the signal line 19 be 30 μm or less due to the restriction in the manufacture of the flexible board, resulting in high ratio of manufacturing tolerance for the line width and the variation of impedance. If the line width of the signal line 19 is narrowed, the cross-sectional area of the signal line 19 is reduced, electric resistance thereof is elevated, and the insertion loss is increased. On the other hand, although the line impedance can be elevated by thickening the flexible board 16, flexibility, which is an inherent feature of the flexible board 16, is lost, specifications for general marketing cannot be met, special materials must be used for maintaining flexibility, and such materials are not easily available.

In the first embodiment, the ground conductor 18 is removed as described above to form the cut-out portion 35. Since there is no ground conductor 18 in the cut-out portion 35, the header 4 functions as a ground conductor. Since the distance between the signal line 19 and the header 4 is wider than the distance between the signal line 19 and the ground conductor 18, a high-impedance line can be easily realized. For example, when the line width of the signal line 19 is 100 μm, and the thickness and the relative permittivity of the flexible board 16 are as described above, the line impedance is 50Ω; however, when the ground conductor 18 is cut out, and the distance between the flexible board 16 and the header 4 is 0.1 mm, the impedance is 100Ω. If the width of the cut-out portion is about three times the line width of the signal line 19, the influence of the ground conductor 18 becomes negligibly small; therefore, the width of the cut-out portion is 300 μm here. In general, since the flexible board 16 is provided with a protective film (not shown) for protecting the signal line 19 and the ground conductor 18, the distance between the flexible board 16 and the header 4 can easily be set to 0.1 mm by the thickness of the protective film. Since the line width is not changed, increase in insertion loss can also be avoided.

The size of the cut-out portion 35 is determined such that the impedance of the signal pin 1 is matched with the impedance of the signal line 19. For example, when the length L of the cut-out portion 35 is not less than 1 mm and not more than 4 mm, the width d is not less than 0.2 mm and not more than 1 mm, and the distance between the flexible board 16 and the header 4 is not less than 0.1 mm and not more than 1 mm, impedance matching is feasible.

Figure 7:
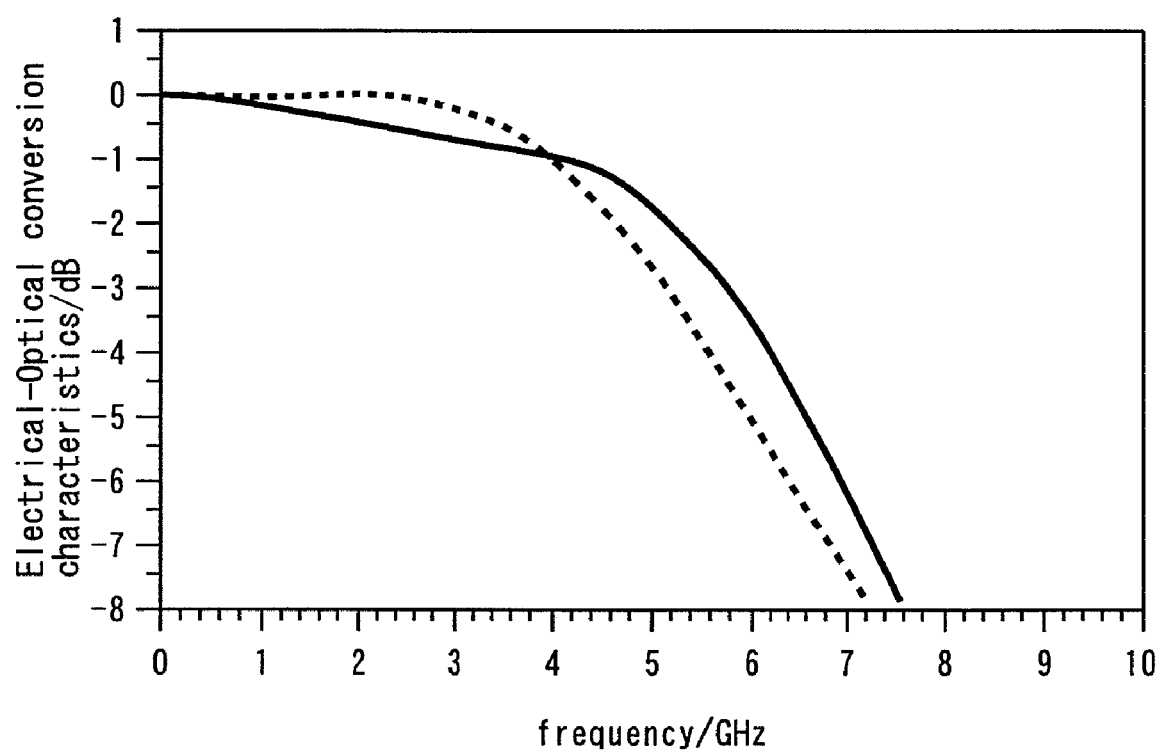
FIG. 7 is a graph showing the result of the simulation of Electrical-Optical conversion characteristics.

FIG. 7 is a graph showing the result of the simulation of electrical-optical conversion characteristics. The characteristics when the cut-out portion 35 is present are shown by a solid line; and the characteristics when the cut-out portion 35 is absent are shown by a dotted line. The size of the cut-out portion 35 represented by L and d in FIG. 5 is L=2 mm, and d=0.3 mm. From the result it can be pointed out that the band width is expanded to the higher frequency by providing the cut-out portion 35.

According to the present embodiment, as described above, the impedance of the signal line 19 by providing the cut-out portion 35 to elevate the impedance of the signal line 19, the impedance of the signal pin 1 can be matched with the impedance of the signal line 19 without providing an impedance-matching circuit. Thereby, the band width can be expanded to the higher frequency.

Since the cut-out portion 35 is formed by the pattern-etching of the ground conductor 18 on the flexible board 16, the cut-out portion 35 can be formed at a high accuracy, and has little dimension variation. Also since the cut-out portion 35 is formed using only pattern-etching, it can be formed at low costs.

The signal pin 1, the grounding pin 27, and the monitor pins 2 and 3 are disposed on a circle that is concentric with the peripheral circle of the header 4. The signal pin 1 and the grounding pin 27 are adjacent to each other. Therefore, the grounding pin 27 can be connected to the ground conductor 18 in the vicinity of the signal line 19, regardless of the presence or absence of the cut-out portion 35. Therefore, stable connection can be achieved even if the impedance of the signal line 19 is elevated by the cut-out portion 35.

Second Embodiment

Figure 8:
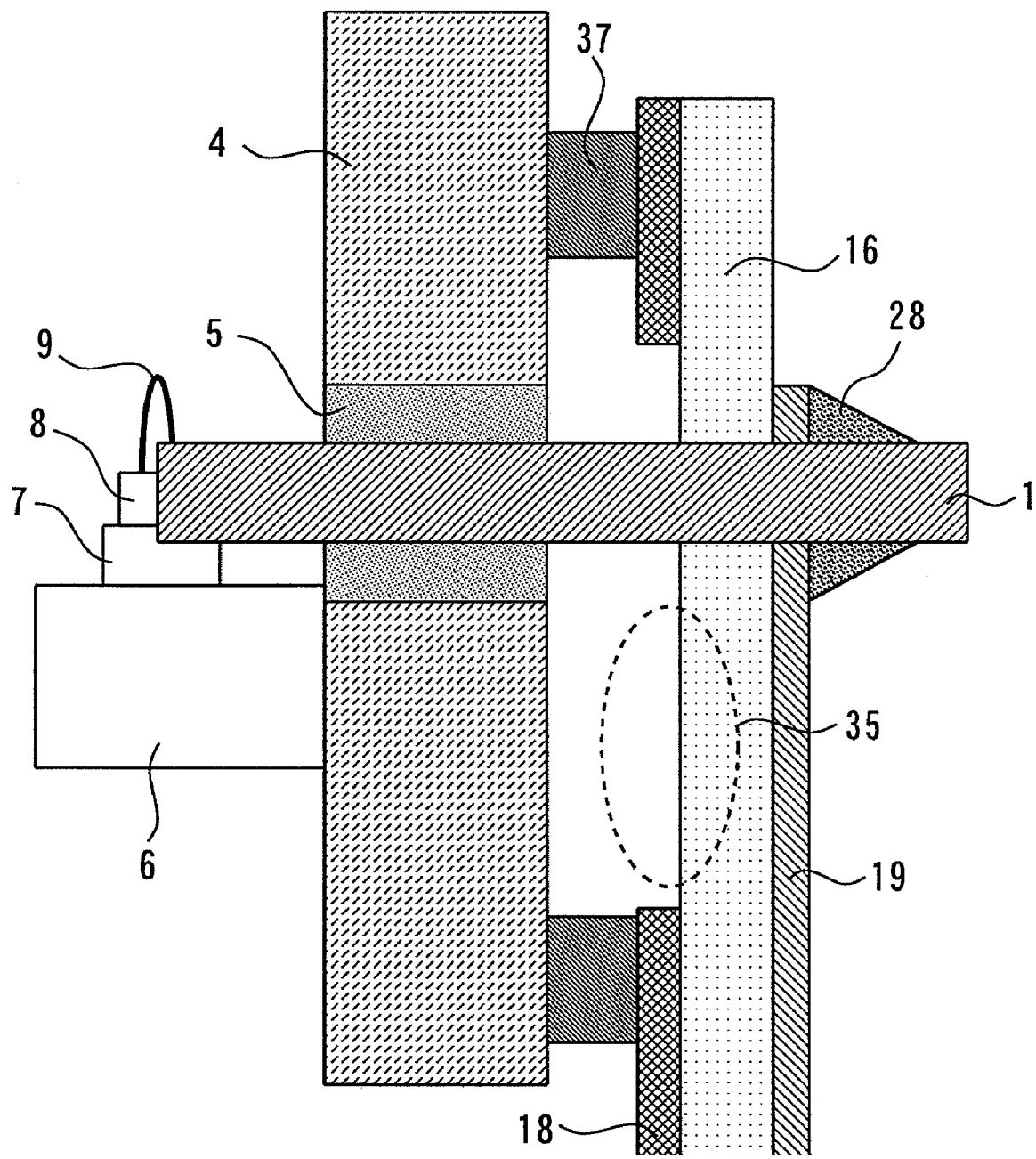
FIG. 8 is a sectional view illustrating an optical module according to the second embodiment.

FIG. 8 is a sectional view illustrating an optical module according to the second embodiment. Spacers 37 are provided between a flexible board 16 and a header 4. Other configurations are identical to the configurations of the first embodiment. By expanding the distance between the signal line 19 and the header 4 using the spacers 37, the capacitance between the signal line 19 and the header 4 in the cut-out portion 35 can be reduced, and a higher impedance line can be realized.

For example, when the width of the signal line 19 was 100 μm, and the distance between the flexible board 16 and the header 4 was 0.1 mm in the first embodiment, the impedance of the signal line 19 was 100Ω. Whereas, when the spacers 37 are provided to expand the distance between the flexible board 16 and the header 4 to 0.3 mm, the impedance of the signal line 19 becomes 150Ω. Therefore, since the signal line 19 has still higher impedance, the low-impedance characteristics of the signal pin 1 can be further compensated.

Figure 9:
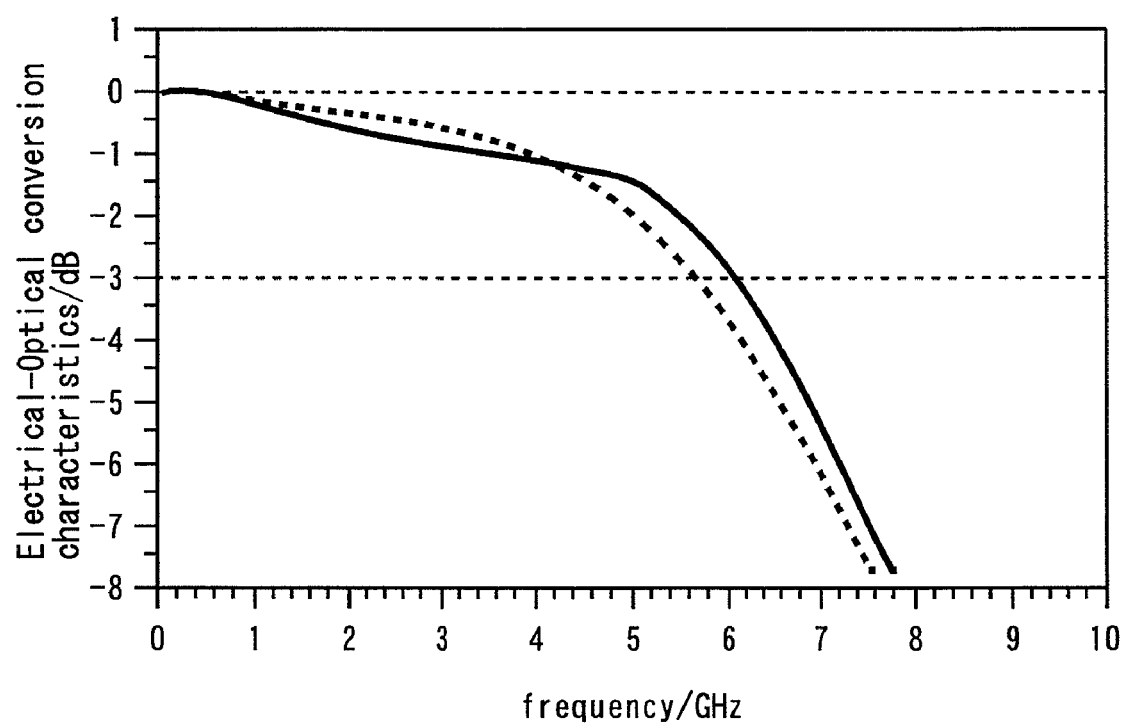
FIG. 9 is a graph showing the result of the simulation of Electrical-Optical conversion characteristics.
Figure 10:
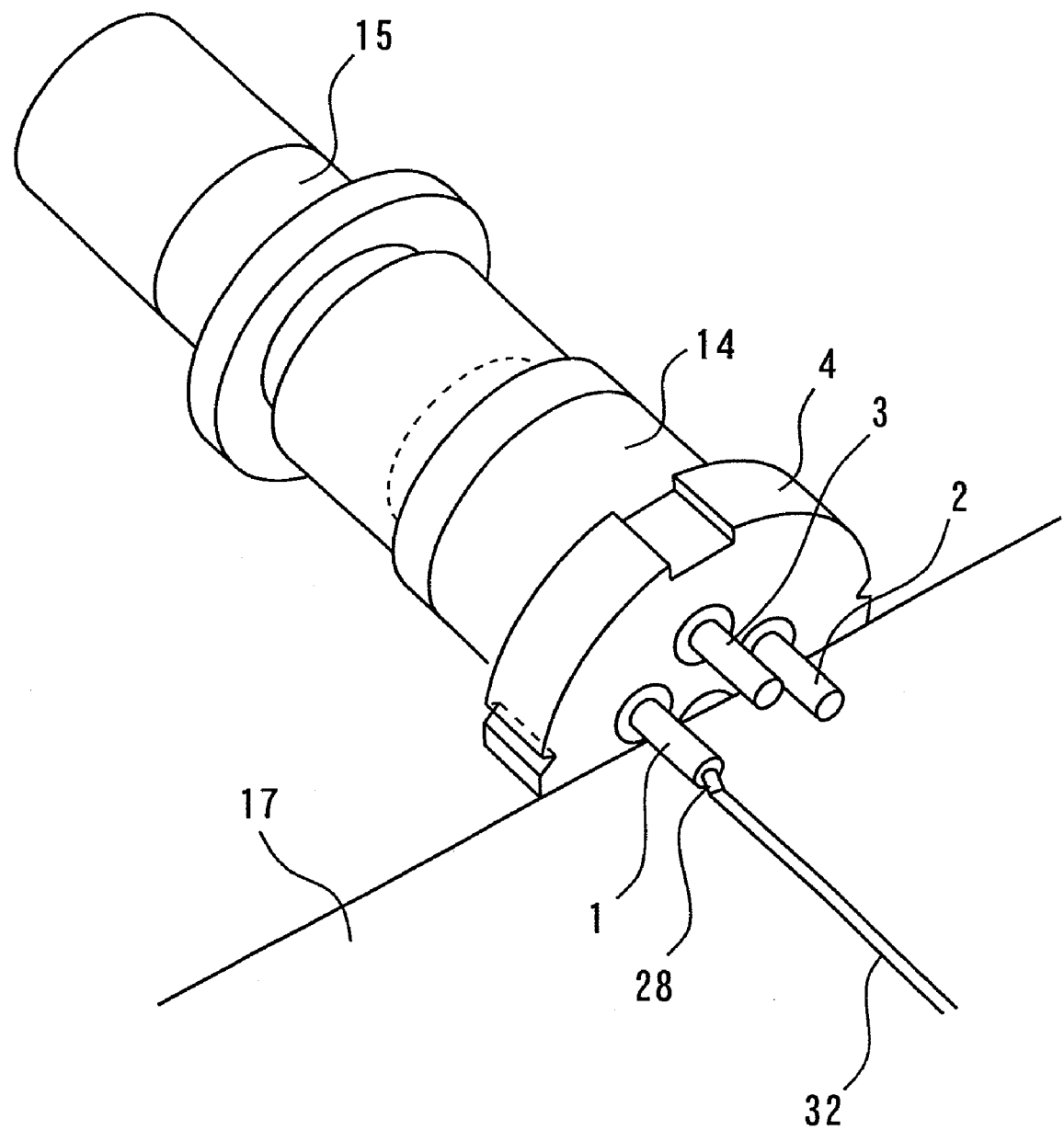
FIG. 10 is a perspective view illustrating a state wherein a conventional optical module is mounted on a printed circuit board.
Figure 11:
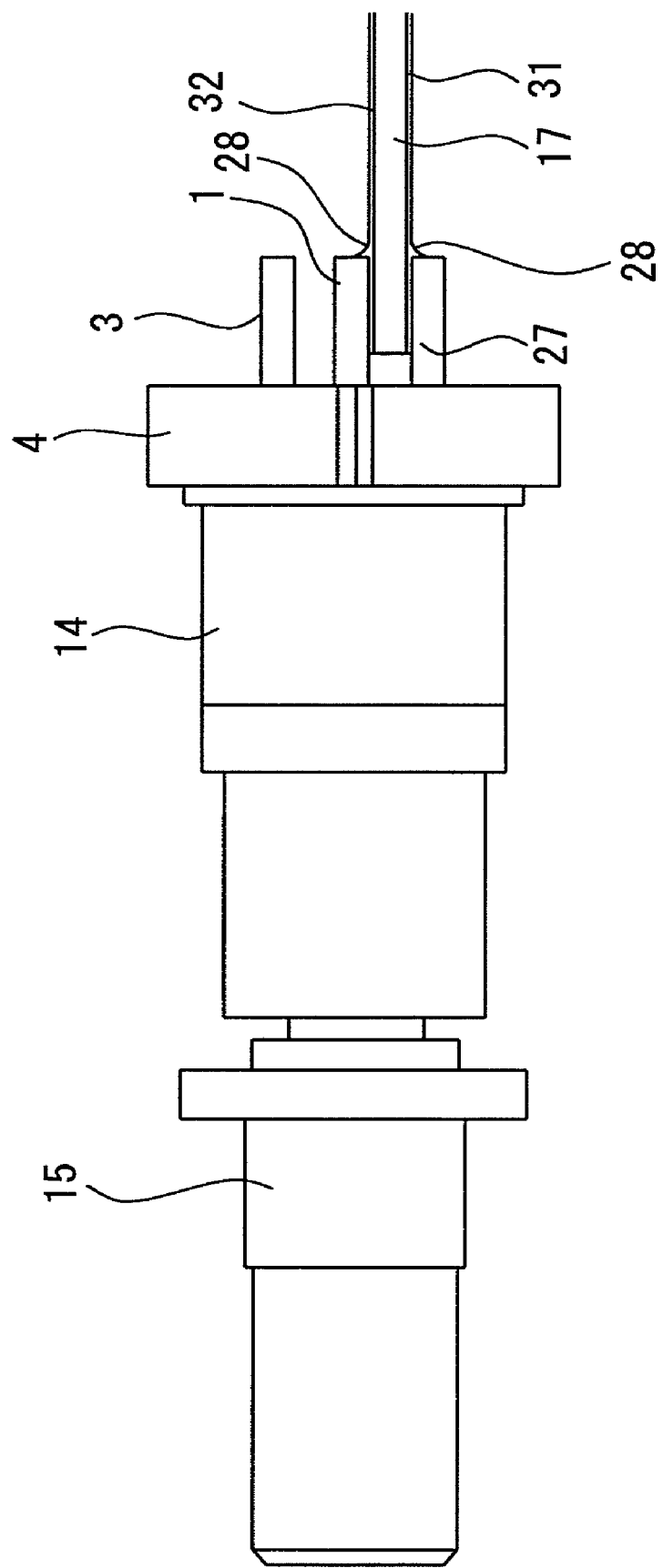
FIG. 11 is a side view illustrating a state wherein a conventional optical module is mounted on a printed circuit board.

FIG. 9 is a graph showing the result of the simulation of electrical-optical conversion characteristics. The characteristics when the cut-out portion 35 is present, and the distance between the flexible board 16 and the header 4 is expanded to 0.3 mm, are shown by a solid line; and the characteristics when the cut-out portion 35 shown in FIG. 7 is present but no spacers are provided are shown by a dotted line. From the result, it is known that the band width is further expanded to the higher frequency by providing the spacers 37.

Since the distance between the flexible board 16 and the header 4 can be made constant by the spacers 37, stable characteristics can be obtained. By fixing the header 4 and the spacers 37 with adhesive members, such as adhesive tapes and adhesives, further stable characteristics can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-306011, filed on Nov. 27, 2007 including specification, claims, drawings and summary, on which the Convention priority of the present application is based, are incorporated herein by reference in its entirety.

What is claimed is:

1. An optical module comprising:
   a header;
   a grounding pin connected to said header;
   a signal pin penetrating and electrically insulated from said header;
   glass filling space between said header and said signal pin;
   a laser diode connected to said signal pin;
   a flexible circuit board facing said header;
   a ground conductor on a first surface of said flexible circuit board, directly facing said header, and connected to said grounding pin;
   a signal line on a second surface of said flexible circuit board, opposite said first surface, and connected to said signal pin; and
   a cut-out portion where said ground conductor is not present on said first surface of said flexible circuit board, located in a region where said header faces said flexible circuit board, and extending from a junction of said signal pin and said signal line, wherein said cut-out portion has a size determined so that impedance of said signal pin is matched to impedance of said signal line, wherein said cut-out portion has a length in an extending direction, which extends along said signal line, from said junction where said signal pin is connected to said signal line, in a range from 1 mm to 4 mm.

2. The optical module according to claim 1, wherein said flexible circuit board and said header are separated by a distance in a range from 0.1 mm to 1 mm.

3. The optical module according to claim 1, wherein said header has a circular periphery and said signal pin and said grounding pin are disposed on a circle that is concentric with the circular periphery of said header.

4. The optical module according to claim 1, further comprising a spacer located between said header and said flexible circuit board.

5. The optical module according to claim 4, including:
   an adhesive member adhering said flexible circuit board to said spacer; and
   an adhesive tape adhering said header to said spacer.

6. An optical module comprising:
   a header;
   a grounding pin electrically connected to said header;
   a signal pin penetrating and electrically insulated from said header;
   glass filling space between said header and said signal pin;
   a laser diode mounted on said header and electrically connected to said signal pin;

a flexible circuit board having opposed first and second surfaces, said first surface facing and being spaced from said header;
  a ground conductor on said first surface of said flexible circuit board and directly facing said header, said ground conductor being electrically connected to said grounding pin;
  a signal line on said second surface of said flexible circuit board and electrically connected to said signal pin at a junction of said signal line and said signal pin on said second surface of said flexible circuit board; and
  a cut-out portion of said ground conductor on said first surface of said flexible circuit board where said ground conductor is not present, wherein
    said cut-out portion is located in a region of said first surface of said flexible circuit board where said header faces said flexible circuit board,
    said cut-out portion surrounds and overlies, on said first surface, said junction which is on said second surface, and extends, on said first surface, from said junction, along and opposite said signal line, and
    said cut-out portion has a size determined so that impedance of said signal pin is matched to impedance of said signal line.

7. The optical module according to claim 6, wherein said cut-out portion has a length, along said signal line, from said junction where said signal pin is connected to said signal line, in a range from 1 mm to 4 mm.

8. The optical module according to claim 6, wherein said flexible circuit board and said header are separated by a distance in a range from 0.1 mm to 1 mm.

9. The optical module according to claim 6, wherein said header has a circular periphery and said signal pin and said grounding pin are disposed on a circle that is concentric with the circular periphery of said header.

10. The optical module according to claim 6, further comprising a spacer located between said header and said flexible circuit board.

11. The optical module according to claim 10, including:
  an adhesive member adhering said flexible circuit board to said spacer; and
  an adhesive tape adhering said header to said spacer.

12. An optical module comprising:
  a header;
  a grounding pin connected to said header;
  a signal pin penetrating and electrically insulated from said header;
  glass filling space between said header and said signal pin;
  a laser diode connected to said signal pin;
  a flexible circuit board facing said header;
  a ground conductor on a first surface of said flexible circuit board, directly facing said header, and connected to said grounding pin;
  a signal line on a second surface of said flexible circuit board, opposite said first surface, and connected to said signal pin; and
  a cut-out portion where said ground conductor is not present on said first surface of said flexible circuit board, located in a region where said header faces said flexible circuit board, and extending from a junction of said signal pin and said signal line, wherein said cut-out portion has a size determined so that impedance of said signal pin is matched to impedance of said signal line.

13. The optical module according to claim 12, wherein said flexible circuit board and said header are separated by a distance in a range from 0.1 mm to 1 mm.

14. The optical module according to claim 12, wherein said header has a circular periphery and said signal pin and said grounding pin are disposed on a circle that is concentric with the circular periphery of said header.

15. The optical module according to claim 12, further comprising a spacer located between said header and said flexible circuit board.

16. The optical module according to claim 15, including:
  an adhesive member adhering said flexible circuit board to said spacer; and
  an adhesive tape adhering said header to said spacer.

* * * * *